(12) United States Patent
Korec et al.

(10) Patent No.: US 6,858,471 B1
(45) Date of Patent: Feb. 22, 2005

(54) SEMICONDUCTOR SUBSTRATE WITH TRENCHES FOR REDUCING SUBSTRATE RESISTANCE

(75) Inventors: Jacek Korec, San Jose, CA (US); Robert Q. Xu, Fremont, CA (US); Mohammed Kasem, Santa Clara, CA (US)

(73) Assignee: Vishay-Siliconix, Santa Clara, CA (US)

( * ) Notice: Subject to any disclaimer, the term of this patent is extended or adjusted under 35 U.S.C. 154(b) by 122 days.

(21) Appl. No.: 10/247,906

(22) Filed: Sep. 20, 2002

(51) Int. Cl.⁷ .............................................. H01L 21/44

(52) U.S. Cl. .................. 438/113; 439/135; 439/459

(58) Field of Search ............................ 438/113, 460, 438/462, 459, 133, 135, 977

(56) References Cited

U.S. PATENT DOCUMENTS

| | | | | |
|---|---|---|---|---|
| 4,224,734 A | * | 9/1980 | Tiefert et al. ................ | 438/460 |
| 5,145,810 A | * | 9/1992 | Matsumi ....................... | 438/53 |
| 5,344,789 A | * | 9/1994 | Terashima .................... | 438/271 |
| 6,642,126 B2 | * | 11/2003 | Igel ............................. | 438/460 |

* cited by examiner

*Primary Examiner*—Tuan H. Nguyen
(74) *Attorney, Agent, or Firm*—Murabito & Hao LLP (57) ABSTRACT

In one embodiment of the present invention, a method for fabricating semiconductor devices comprises forming an active region about a front-side of a substrate. A plurality of trenches are then formed about a back-side of the substrate. A grid of banks separates the trenches. A conductive material is then applied to the back-side of the substrate. The trenches and the conductive material act to reduce the on-state resistance of the substrate and enhance thermal conductivity, while the grid of banks maintains the structural strength of the wafer.

38 Claims, 8 Drawing Sheets

SEMICONDUCTOR SUBSTRATE WITH TRENCHES FOR REDUCING SUBSTRATE RESISTANCE

FIELD OF THE INVENTION

Embodiments of the present invention relate to semiconductor device fabrication, and more particularly to reduced substrate resistance characteristics.

BACKGROUND OF THE INVENTION

For power metal oxide semiconductor field effect transistors (MOSFET), substrate resistance contributes to the total on-state resistance as a parasitic component. A vertical semiconductor device like a vertical double-diffused MOSFET (VDMOSFET), a trench MOSFET (TMOSFET), an insulated gate bipolar transistor (IGBT), or the like, represent a power switch. The resistance in the on-state of the switch is composed of a series connection of resistive elements.

Figure 1A:
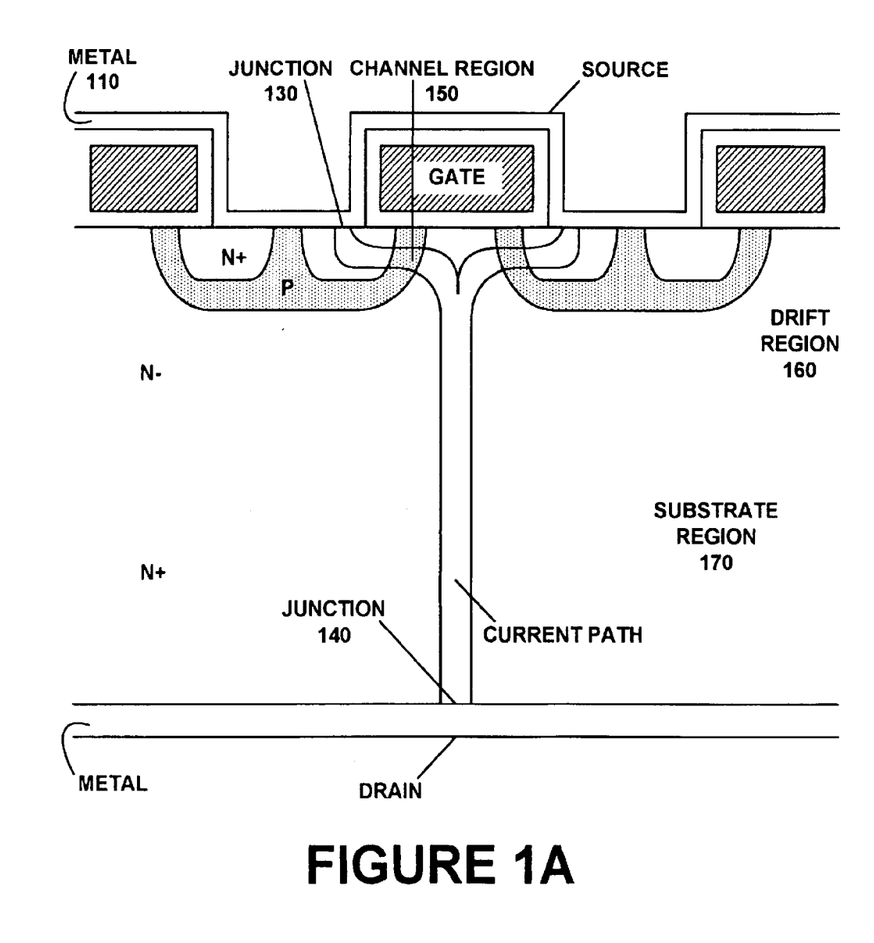
FIG. 1A shows a cross sectional view of a VDMOSFET device employed in the conventional art.
Figure 1B:
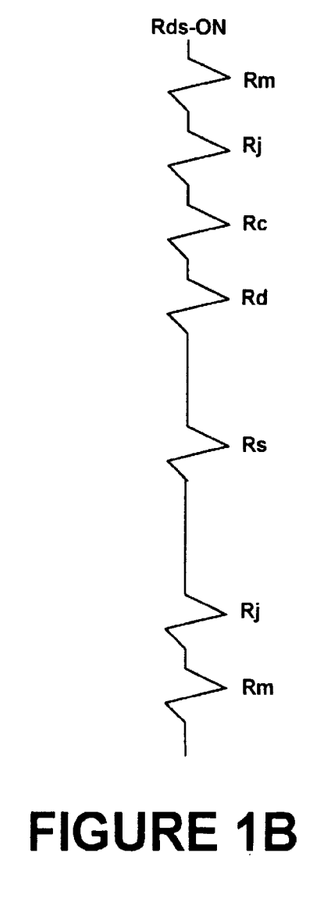
FIG. 1B shows a corresponding series connection of resistive elements modeling the conductive path in a VDMOSFET (FIG. 1A) device employed in the conventional art.

FIG. 1A shows a cross sectional view of an VDMOSFET device employed in the conventional art. While FIG. 1B shows a corresponding series connection of resistive elements modeling the conductive path in the device in the on-state employed in the conventional art. The on-state resistance ($R_{ds-on}$) comprises metal film resistance (Rm) 110, 120, junction between metal film and semiconductor (i.e. drain and source) resistance (Rj) 130, 140, channel resistance (Rc) 150, drift region resistance (Rd) 160, and substrate region resistance (Rs) 170. In the case of current low voltage power MOSFETs the substrate resistance (Rs) 170 contribution can be at least 40% of the total on-state resistance (Rds-on). Reducing the on-state resistance is beneficial to making the switch more efficient.

As semiconductor technology progresses, reduced on-state resistance becomes critical. In the conventional art, thinning the substrate by a method such as back-lapping and polishing the wafer can achieve some reduced on-state resistance. Wafer thickness is currently about 200 µm. Thinner wafers are possible. However, thin wafers can easily break during handling thereby resulting in lower manufacturing yields. It would be desirable to reduce the on-state resistance of the power switch without resulting in the poor manufacturing yields attributed to very thin wafers.

SUMMARY OF THE INVENTION

Thus, there is a need for a semiconductor device having improved on-state resistance. What is needed further is a means for reducing on-state resistance of a semiconductor power switch without reducing manufacturing yields, e.g., without making the wafer overly thin.

In one embodiment of the present invention, a method for fabricating semiconductor devices comprises forming an active region about a front-side of a substrate. A plurality of trenches is then formed about a back-side of the substrate. A grid of banks separates the trenches. The trenches act to reduce the on-state resistance, while the grid of banks maintains the structural strength of the wafer.

In another embodiment of the present invention, a method for fabricating semiconductor devices comprises forming an active region about a front-side of a substrate. A plurality of trenches is then formed about a back-side of the substrate. A grid of banks separates the trenches. A conductive layer is then deposited on the back-side of the substrate. The trenches act to reduce the on-state resistance, while the grid of banks maintains the structural strength of the wafer. The conductive layer further improves the resistance of the substrate during the on-state of the device.

In another embodiment of the present invention, a method for fabricating semiconductor devices comprises forming an active region about a front-side of a substrate. A plurality of trenches is then formed about a back-side of the substrate. A grid of banks separates the trenches. A conductive material is then deposited on the back-side of the substrate and fills the trenches. The trenches act to reduce the on-state resistance, while the grid of banks maintains the structural strength of the wafer. The conductive material and trenches further increases thermal and electrical conductivity of the substrate during the on-state of the device.

Embodiments of the invention reduce substrate resistance measured across the wafer without any negative impact on yield of the device during manufacturing. The solution according to the invention is to modify the substrate by etching trenches from the back-side and filling them with a conductive material. In one embodiment, the trenches being randomly distributed across the wafer collect the majority of the current flowing between the device contacts on the front-side of the substrate and its back-side metallization. In another embodiment, the trenches being aligned to the layout of the devices at the front-side of the wafer collect the majority of current flowing between the device contacts on the front-side of the substrate and its back-side metallization.

In one embodiment, the trenches are etched after the completion of the front-side manufacturing of the device. The front-side of the processed wafer is covered with an insulating film called a passivation layer. The wafers leave the clean room and are grinned from the back-side to a predefined thickness, e.g. 200 µm.

In one example, the back-side of the substrate is covered with a photoresist which is used as a mask to etch the trenches. The mask openings are not aligned to the devices located at the front-side of the substrate. The opening dimensions are less than one quarter (¼) of the edge dimension of the device die in one example, and the opening locations are random with respect to the device dies. The depth of the trenches may exceed half the thickness of the finished wafer. The photoresist mask is removed and a standard back-side metal can be deposited. In an exemplary embodiment, the back-side metal may be solderable, e.g., it can consist of a tri-metal layer of tin, nickel, and silver (Ti/Ni/Ag).

In one embodiment, a photoresist mask is applied to the front side of the wafer and pad openings may be etched in the passivation layer to define the location of the electric contacts to the devices. The wafer is sawed to singulate the dies and the trenches from the back-side are filled with a conductive material, e.g. it can be a solder paste or a conductive epoxy.

As another embodiment of the present invention, the trenches are filled with the conductive material after the deposition of the back-side metal and before the singulation of the dies.

Accordingly, embodiments of the present invention provide semiconductor devices having trenches and a conducting layer on the back-side of the substrate, adapted to reduce substrate resistance. Embodiments of the present invention also provide semiconductor devices having banks on the back-side of the substrate, adapted to assure mechanical stiffness of the substrate.

BRIEF DESCRIPTION OF THE DRAWINGS

The present invention is illustrated by way of example and not by way of limitation, in the figures of the accompanying drawings and in which like reference numerals refer to similar elements and in which.

DETAILED DESCRIPTION OF THE INVENTION

Reference will now be made in detail to the embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail as not to unnecessarily obscure aspects of the present invention.

Embodiments of the present invention reduce substrate resistance by etching trenches into the substrate from the back-side and filling the trenches with a conductive material. Embodiments of the present invention also maintain the structural strength of the substrate. Thus, embodiments of the present invention advantageously reduce on-state resistance without reducing manufacturing yield.

Figure 2:
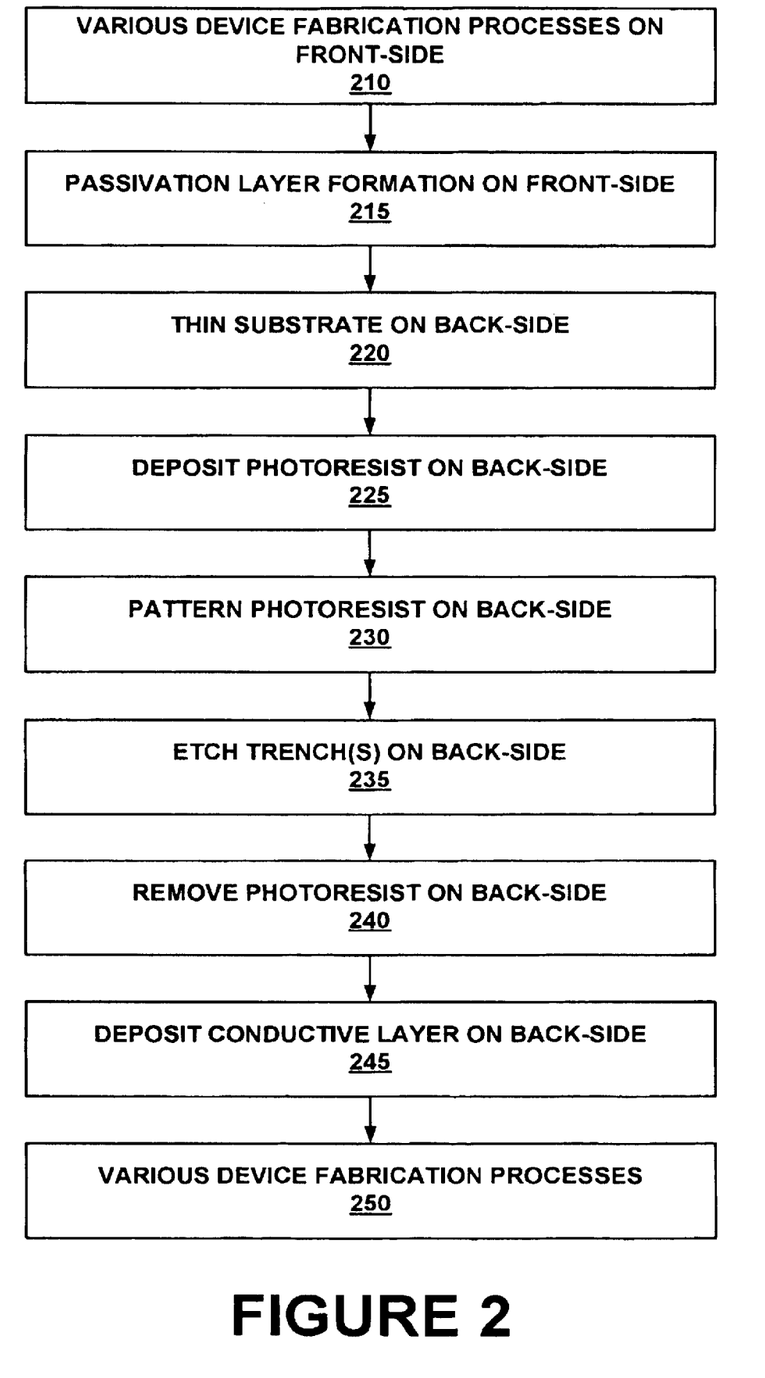
FIG. 2 shows a flow diagram of a process for reducing substrate resistance in accordance with one embodiment of the present invention.

Referring now to FIG. 2, a flow diagram of a process for reducing substrate resistance in accordance with one embodiment of the present invention is shown. As depicted in FIG. 2, device fabrication begins with various well known device fabrication processes, at steps 210. The various device fabrication processes may include deposition, implanting, diffusion, etching, masking, photolithography, and the like. The various device fabrication processes result in formation of an active layer on the front-side of the substrate.

The active layer is comprised of a plurality of die regions. Each die region is comprised of one or more components, interconnects, and the like. The plurality of die regions is laid out in a pattern on the front-side of the wafer. Each die region is separated from another by scribing borders. The scribing borders allow for separation of the die regions at the end of processing, so that they may be packaged as individual devices.

A passivation layer is then formed on the front-side of the substrate, at step 215. The passivation layer may be formed by any well-known method, such as deposition, evaporation, sputtering, chemical vapor deposition (CVD), or the like. The passivation layer provides electrical component isolation. The passivation layer also provides physical protection for the active region, during subsequent handling and fabrication processes.

The substrate is then thinned, at step 220. The substrate may be thinned by any well-known method, such as back-lapping and polishing or the like. The back-lapping and polishing process is performed on the back-side of the wafer. In an exemplary configuration, the resulting substrate has a final thickness of 150–300 $\mu m$.

A photoresist is then coated on the back-side of the wafer, at step 225. The photoresist is then patterned at step 230. The patterning may de done by any well-known method, such photolithography, or the like.

Photolithography typically utilizes a photomask and ultraviolet light, wherein the photoresist is selectively exposed to form a desired pattern of areas covered with photoresist and uncovered areas. In one implementation, the shape, size and location of the mask openings may be of any configuration. In another implementation, the mask provides a pattern of openings not aligned to the die regions on the front-side of the substrate. The opening locations are random with respect to the die regions. In another implementation, the mask opening dimensions are less than one-quarter (¼) of the edge dimension of the die region. Thus, there are a few openings placed on the back-side, corresponding to the area of a die region. In another implementation, the openings are in the shape of small squares forming a modified chessboard pattern. In another implementation, the openings are arranged so that areas on the back-side of the wafer, which correspond with the scribing borders on the front-side of the wafer, do not contain openings. Aligning the pattern of die regions on the front of the wafer and the openings on the back of the wafer can be accomplished with any well-known means.

The back-side of the substrate is then etched at step 235. The etching may be done by any well-known method, such as wet etching, dry etching or the like. The etching process forms a pattern of one or more trenches and banks on the back-side of the substrate, as defined by the patterned photoresist.

In one implementation, the etching process may have a significant isotropic component. Thus, the openings of the resulting trenches are greater than the opening in the patterned photoresist. In another implementation, the isotropic etching process results in trench walls with sloped sides. In an exemplary configuration, the slope of the trench walls is less than 85°.

In another implementation, the banks form a common grid assure mechanical stiffness of the wafer. In another implementation, the banks do not form any straight lines corresponding to the pattern of the die regions. In another implementation, areas on the back-side of the wafer, which correspond with the scribing borders on the front-side of the wafer, do not contain trenches.

The photoresist is then removed from the back-side of the wafer, at step 240. The photoresist removal process may be done by any well-known method, such as chemical resist strip, resist ashing, or the like.

The back-side of the wafer is then subjected to a metallization process, at step 245. The metallization process can be performed by any well-known means, such as evaporation, sputtering, or the like. In one implementation, the resulting conductive layer conformal coats the back-side of the substrate, including the banks, trench side-walls, and trench floors.

In one implementation of the present invention, the conductive layer is formed by a tri-metal multi-layer, which provides good electric contact to the substrate and a solderable surface. In an exemplary configuration the tri-metal multi-layer consists of tin, nickel and silver (Ti/Ni/Ag). In another implementation, the conductive layer is a conductive material, which planarizes the back-side of the wafer. The planarizing conductive material fills the trenches. In an exemplary configuration, the planarizing conductive material is a solder paste. In another exemplary configuration, the planarizing conductive material is a conductive epoxy.

Device fabrication then continues with various device fabrication processes, at steps 250. The various device fabrication process steps may include forming contact pad regions, singulation of the wafer into individual die, die attachment, wire bonding, and the like.

In an alternative embodiment of the present invention, the trenches are filled with a conductive material after the deposition of the metal layer on the back-side of the wafer and before the singulation of the dies. The conductive material planarizes the back-side of the wafer prior to singulation.

The methods of the present embodiments provide the advantage of reducing substrate resistance. The methods of the present embodiments also provide the advantage of collecting the majority of current flowing between the device contacts, by the back-side metallization. The methods of the present embodiments also provide the advantage of maintaining structural strength of the substrate.

Referring now to FIGS. 3A–3F, side-sectional views of a wafer 305 being processed in accordance with one embodiment of the present invention are shown. As depicted FIG. 3A, the wafer 305 initially comprises a substrate 310 with an active region formed thereon 315 (i.e. front-side). A passivation layer 320 covers the active region. In one exemplary configuration, the wafer 305 has a thickness of 150–300 μm.

Figure 3A:
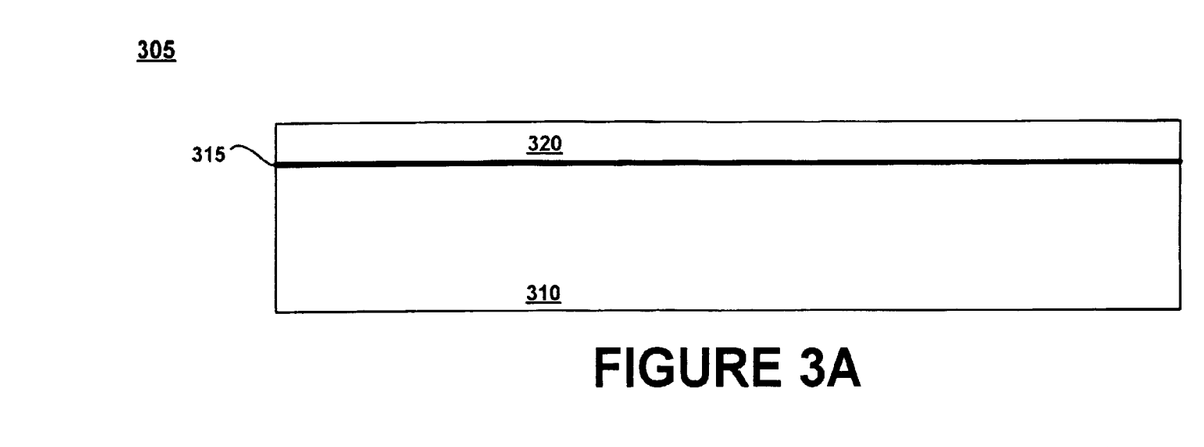
FIGS. 3A, 3B, 3C, 3D, 3E, and 3F show side-sectional views of a wafer being processed in accordance with one embodiment of the present invention.
Figure 3B:
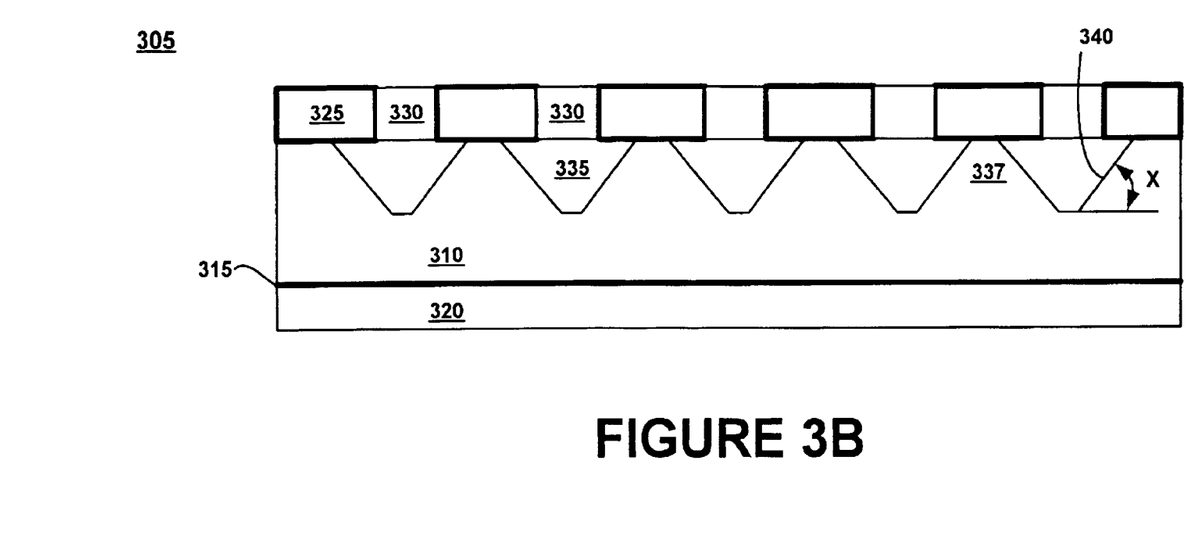

As depicted in FIG. 3B, a photoresist layer 325 is deposited on the substrate 310 (e.g. back-side). The photoresist is patterned to form a plurality of openings 330. Trenches 335 are formed in the substrate 310 under the plurality of openings 330 in the photoresist layer 325. Banks 337 of substrate 310 remain where the photoresist layer 325 is present.

In one implementation of the present invention, the depth of the trenches 335 exceeds half the thickness of the substrate 310 and does not extend to the active region 315. In an exemplary configuration, the depth of the trenches 335 is approximately 100–200 μm. In another implementation, the sides 340 of the trenches 335 are sloped. In an exemplary configuration, the sloped sides 340 of the trenches 335 have an angle α, which is less than 85°. In another implementation, the size, shape and spacing of the trenches 335 may be of any configuration. In another implementation, the trenches 335 are randomly spaced with respect to corresponding die regions on the front-side of the wafer 305. In another implementation, the trenches 335 are not located corresponding to scribing borders between the die regions on the front-side of the wafer 305. In another implementation, the plurality of trenches 335 are located in a region corresponding to each die region on the front-side of the wafer 305.

In another implementation, the width and/or length of the trenches 335 is a fraction of the edge length and/or width of the die regions. In an exemplary configuration, the width and/or length of the trenches 335 is approximately one quarter (¼) of the edge length and/or width of the die regions. In another implementation, the shape of the trenches 335 are square and arranged to form a modified chessboard pattern with a grid of banks separating the trenches. In one implementation, the trenches 335 should not be of sufficient length and/or width to form a straight groove, susceptible to cleaving, in the pattern of the grid of banks 337. Thus, the banks 337 form a common grid assuring mechanical stiffness of the wafer 305.

Figure 3C:
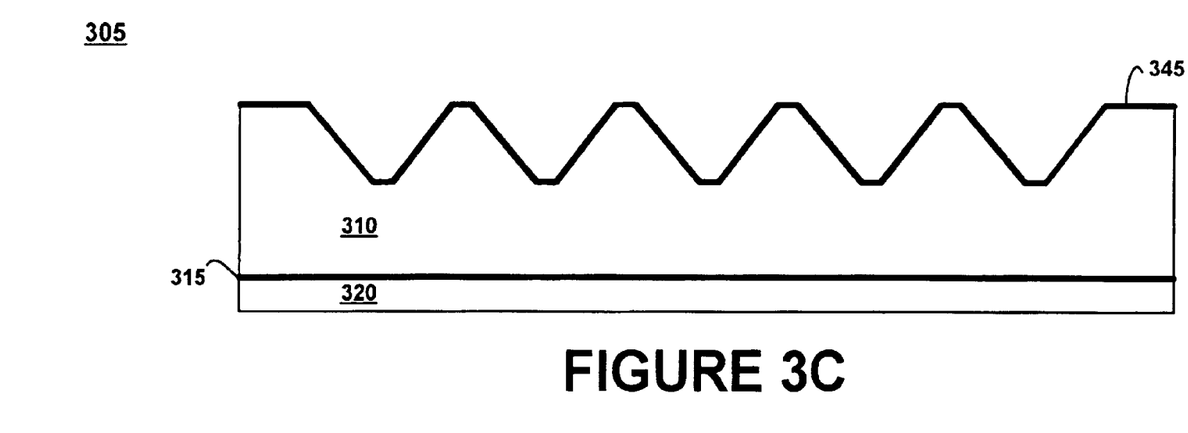

As depicted in FIG. 3C, the photoresist layer 325 is stripped and a conformal conductive layer 345 is deposited on the substrate 310 (e.g. back-side).

In one implementation of the present invention, the conductive layer 345 is a tri-metal multi-layer, which provides good electric contact to the substrate, and a solderable surface. In an exemplary configuration the tri-metal multi-layer consisting of Ti/Ni/Ag.

Figure 3D:
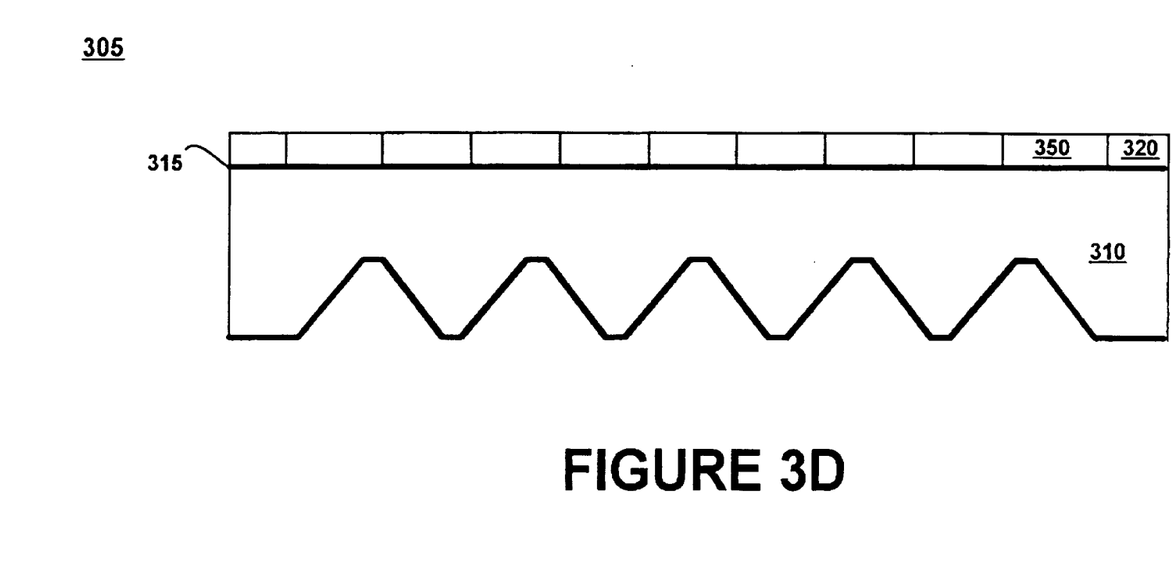

As depicted in FIG. 3D, the passivation layer 320 is patterned to define contact pad openings 350.

Figure 3E:
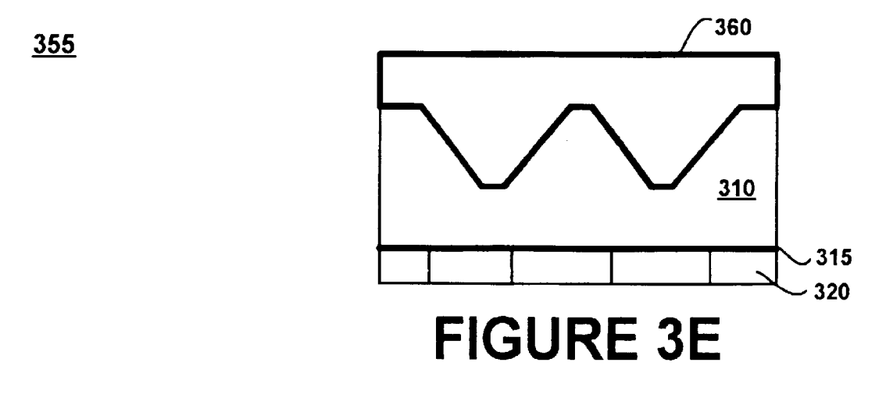

As depicted in FIG. 3E, the wafer 305 is separated, along the scribing borders, into individual die 355 (a single die is shown for illustrative purposes). Furthermore, the trenches are filled with a conductive material 360, which planarizes the back-side of the substrate 310. In an exemplary configuration, the planarizing conductive material 360 is a solder paste. In another exemplary configuration, the planarizing conductive material 360 is a conductive epoxy.

Figure 3F:
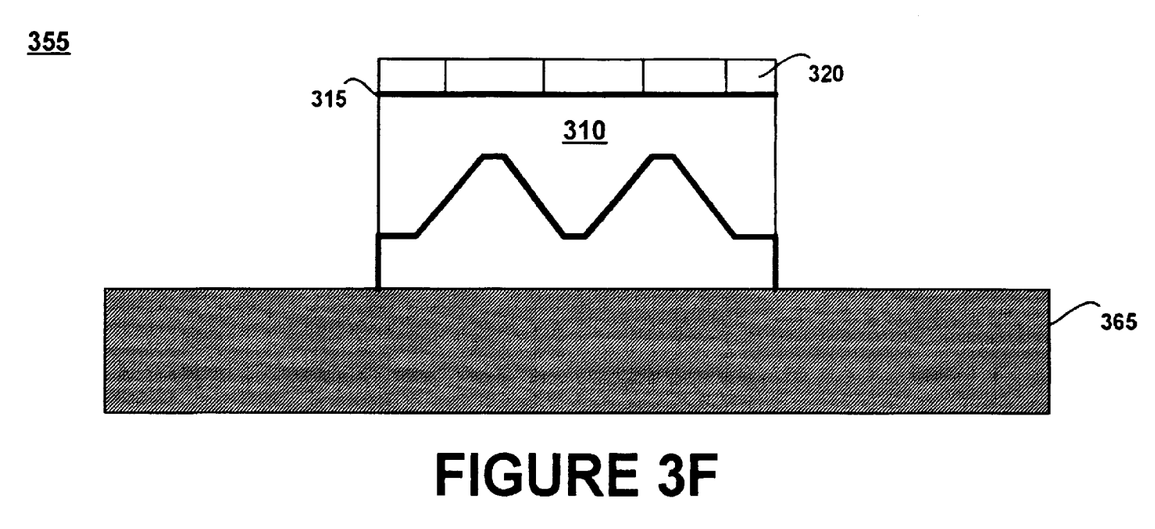

As depicted in FIG. 3F, the die 355 is packaged on a frame 365. The die and frame form a subassembly of the final device packaging, such as TO-type package, small outline integrated circuit (SOIC), or the like.

In an alternative embodiment of the present invention, the trenches 335 are filled with a conductive material 360 after the deposition of the back metal layer 345 and before singulation of the dies.

The present embodiments provide the advantage of reducing substrate 310 resistance. The present embodiments also provide the advantage of collecting the majority of current flowing between the device contacts, by the back-side metallization 345. The present embodiments also provide the advantage of maintaining structural strength of the substrate 310.

The present embodiments provide the advantage of reducing substrate 310 resistance, both thermal and electrical. The substrate 310 is thinner and the back-side conductive layer 345 and/or conductive material 360 is closer to the active region 315. Therefore, the thinner substrate 310 provides for reduced electrical resistance. Furthermore, the back-side conductive layer 345 and/or conductive material 360 readily removes thermal heat generated in the substrate 310. While, the back-side conductive layer 345 and/or conductive material 360 also collects the majority of current flowing between device contacts, such as front-side source contacts and back-side drain contact. Thus, the present embodiments also provide the advantage of increasing device reliability by reducing thermal and electrical resistance. The present embodiments also provide the advantage of maintaining structural strength of the wafer 305.

Figure 4:
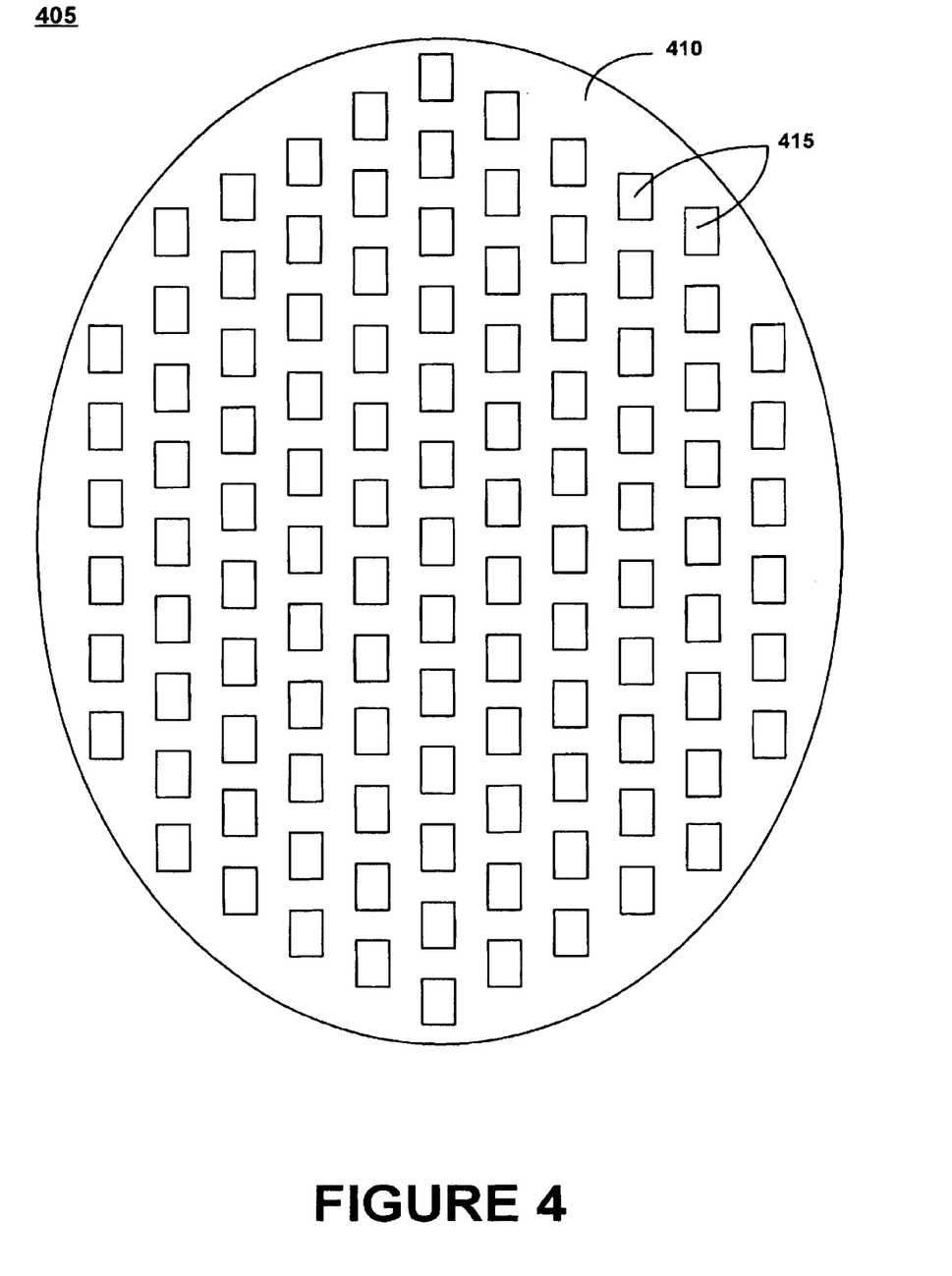
FIG. 4 shows a back-side plain view of a patterned photoresist layer on a wafer in accordance with one embodiment of the present invention.

Referring now to FIG. 4, a back-side plain view of a patterned photoresist layer 410 on a wafer 405 in accordance with one embodiment of the present invention is shown. As depicted in FIG. 4, the back-side of the wafer 405 is substantially covered with a photoresist 410. Sections of the photoresist 410 have been removed to define a pattern of openings 415.

In one implementation, the size, shape and spacing of the openings 415 may be of any configuration. In another implementation, the openings 415 are randomly spaced with respect to corresponding die regions on the front-side of the wafer 405. In another implementation, the width and/or length of the openings 415 is a fraction of the edge length and/or width of the die regions. In an exemplary configuration, the width and/or length of the openings 415 is less than one quarter (¼) of the edge length and/or width of the die regions. In another implementation, the openings 415 are arranged so that the areas on the back-side of the wafer 405, which correspond with scribing borders on the front-side of the wafer 405, do not contain openings 415. In another implementation, a plurality of openings 415 are located corresponding to each die region on the front-side of the wafer 405. In another implementation, the shape of the openings 415 are square and arranged to form a modified chessboard pattern with a grid of photoresist 410 separating the openings 415. In another implementation, the openings 415 should not be of sufficient length and/or width to form a straight groove in the pattern of the grid of photoresist 410.

Figure 5:
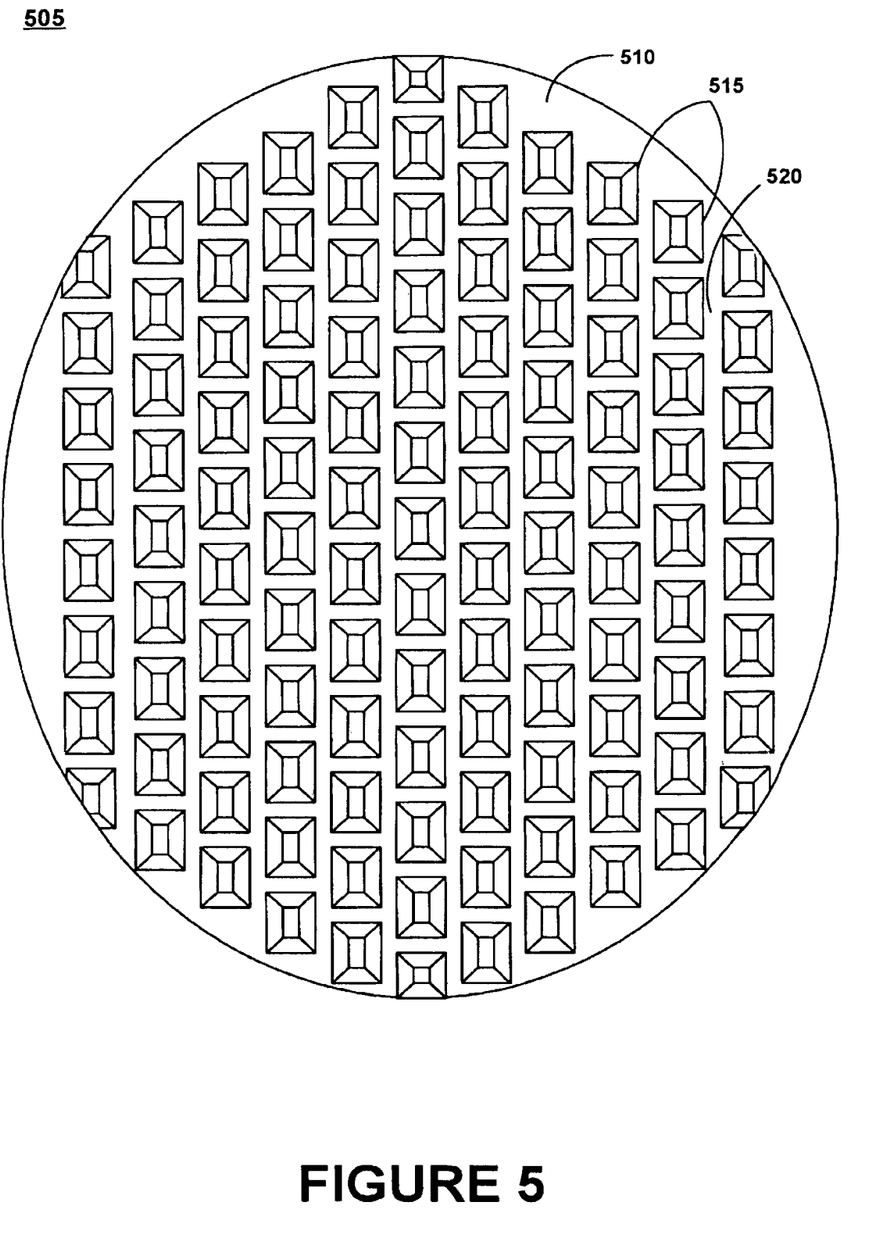
FIG. 5 shows a back-side plain view of a wafer having a grid of trenches etched therein in accordance with one embodiment of the present invention.

Referring now to FIG. 5, a back-side plain view of a wafer 505 in accordance with one embodiment of the present invention is shown. As depicted in FIG. 5, the back-side of the wafer 505 has a plurality of trenches 515 etched into a substrate 510. Banks 520 separate the trenches 515.

In one implementation of the present invention, the depth of the trenches 515 exceeds half the thickness of the substrate 510. In an exemplary configuration, the depth of the trenches 515 is approximately 100–200 μm, for a wafer 505 of approximately 150–300 μm thick. In another implementation, the sides of the trenches 515 are sloped. In an exemplary configuration, the sloped sides of the trenches 515 have an angle α, which is less than 85°. In another implementation, the size, shape and spacing of the trenches 515 may be of any configuration. In another implementation, the trenches 515 are randomly spaced with respect to corresponding die regions on the front-side of the wafer 505. In another implementation, the width and/or length of the trenches 515 is a fraction of the edge length and/or width of die regions on the front-side of the wafer 505. In an exemplary configuration, the width and/or length of the trenches 515 is approximately one quarter (¼) of the edge length and/or width of the die regions. In another implementation, areas on the back-side of the wafer 505, which correspond with scribing borders on the front-side of the wafer 505, do not contain trenches 515. In another implementation, the shape of the trenches 515 are square and arranged to form a modified chessboard pattern with a grid of banks 520 separating the trenches 515. In another implementation, the trenches 515 should not be of sufficient length and/or width to form a straight groove, susceptible to cleaving, in the pattern of the grid of banks 520. Thus, the banks 520 form a common grid assuring mechanical stiffness of the wafer 505.

The present embodiment provides the advantage of reducing substrate 510 resistance, both thermal and electrical. The present embodiment also provides the advantage of maintaining structural strength of the wafer 505.

Figure 6:
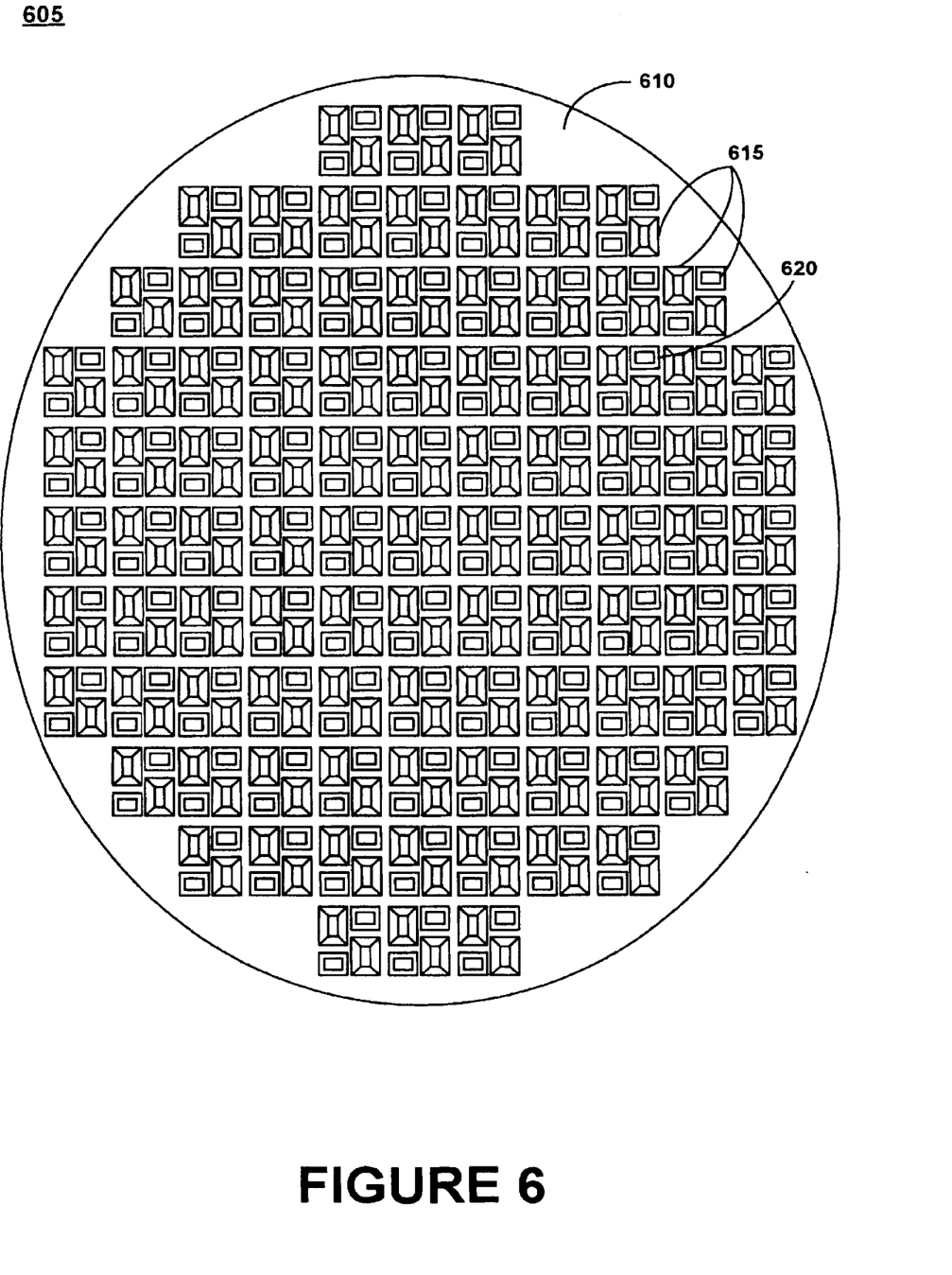
FIG. 6 shows a back-side plain view of a wafer having a grid of trenches etched therein in accordance with another embodiment of the present invention.

Referring now to FIG. 6, a back-side plain view of a wafer 605 having a grid of trenches 615 etched therein in accordance with another embodiment of the present invention is shown. As depicted in FIG. 6, the back-side of the wafer 605 has a plurality of trenches 615 etched into a substrate 610. Banks 620 separate the trenches 615.

In one implementation of the present invention, the depth of the trenches 615 exceeds half the thickness of the substrate 610. In an exemplary configuration, the depth of the trenches 615 is approximately 100–200 μm, for a wafer 605 of approximately 150–300 μm thick. In another implementation, the sides of the trenches 615 are sloped. In an exemplary configuration, the sloped sides of the trenches 615 have an angle α, which is less than 85°. In another implementation, the size, shape and spacing of the trenches 615 may be of any configuration. In another implementation, the trenches 615 are randomly spaced with respect to corresponding die regions on the front-side of the wafer 605. In another implementation, the width and/or length of each trench 615 is a fraction of the edge length and/or width of the die regions. In an exemplary configuration, the width and/or length of each trench 615 is approximately one quarter (¼) of the edge length and/or width of the die regions. In another implementation, areas on the back-side of the wafer 605, which correspond with scribing borders on the front-side of the wafer 605, do not contain trenches 615.

In another implementation, a plurality of trenches 615 are placed in a region corresponding to each die region on the front-side of the wafer 605. In another implementation, the shape of the trenches 615 are various sized squares and arranged to form a modified chessboard pattern with a grid of banks 620 separating the trenches 615. In another implementation, the trenches 615 should not be of sufficient length and/or width to form a straight groove, susceptible to cleaving, in the pattern of the grid of banks 620. Thus, the banks 620 form a common grid assuring mechanical stiffness of the wafer 605.

The present embodiment provides the advantage of reducing substrate 610 resistance, both thermal and electrical. The present embodiment also provides the advantage of maintaining structural strength of the wafer 605.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method of fabricating a semiconductor device, comprising:
   forming an active region about a front-side of a substrate; and
   forming a plurality of trenches about a back-side of the substrate, wherein the plurality of trenches form a grid of banks for maintaining structural strength of the substrate.

2. The method of fabricating a semiconductor device according to claim 1, wherein the active region comprises a plurality of die regions, and wherein the plurality of trenches are spaced randomly apart with respect to the die regions.

3. The method of fabricating a semiconductor device according to claim 1, wherein the active region comprises a plurality of die regions, and wherein two or more trenches are located within a region corresponding each die region.

4. The method of fabricating a semiconductor device according to claim 1, wherein the trenches have sloped sides.

5. The method of fabricating a semiconductor device according to claim 1, wherein the trenches reduce substrate on-state resistance.

6. The method of fabricating a semiconductor device according to claim 1, further comprising:
depositing a metal layer on the back-side of the substrate, wherein the metal layer is deposited after forming the trenches.

7. The method of fabricating a semiconductor device according to claim 6, wherein the trenches and the metal layer reduce substrate electrical resistance.

8. The method of fabricating a semiconductor device according to claim 6, wherein the trenches and the metal layer increase substrate thermal conductivity.

9. The method of fabricating a semiconductor device according to claim 6, wherein the trenches and the metal layer are adapted to increase reliability of the semiconductor device.

10. The method of fabricating a semiconductor device according to claim 1, further comprising thinning the substrate before forming the plurality of trenches.

11. The method of fabricating a semiconductor device according to claim 1, wherein a depth of the trenches exceed half a thickness of the substrate and does not extend to the active region.

12. A device die comprising:
a substrate;
an active region, wherein the active region is formed about a front-side of the substrate;
one or more trenches, wherein the trenches are formed about a back-side of the substrate; and
one or more banks forming a grid adapted to assure mechanical stiffness of the substrate, wherein the banks are formed about the back-side of the substrate between the trenches.

13. The device die according to claim 12, wherein the trenches have sloped sides.

14. The device die according to claim 12, wherein the trenches reduce substrate resistance.

15. The device die according to claim 12, further comprising:
a conductive layer, wherein the conductive layer is formed on the back-side of the substrate after the trenches are formed.

16. The device die according to claim 15, wherein the conductive layer is a tri-metal multi layer.

17. The device die according to claim 15, wherein the conductive layer is a solder paste.

18. The device die according to claim 15, wherein the conductive layer is a conductive epoxy.

19. The device die according to claim 15, wherein the conductive layer is adapted to planarize the back-side of the substrate.

20. The device die according to claim 15, wherein the trenches and the conductive layer reduce substrate electrical resistance.

21. The device die according to claim 15, wherein the trenches and the conductive layer increase substrate thermal conductivity.

22. The device die according to claim 12, wherein a depth of the trenches exceeds half a thickness of the substrate.

23. The device die according to claim 22, wherein the depth of the trenches does not extend to the active region.

24. A wafer, comprising:
a substrate;
an active region, wherein the active region is formed about a front-side of the substrate, and wherein the active region further comprises a plurality of device dies separated by scribing borders;
a plurality of trenches, wherein the trenches are formed about a back-side of the substrate and wherein two or more trenches are placed in a region corresponding to each device die;
a grid of banks adapted to maintain structural strength of the wafer, wherein the banks are formed between the trenches; and
a conductive layer, wherein the conductive layer conformal coats the trenches and banks formed about the back-side of the substrate.

25. The wafer according to claim 24, wherein the trenches have sloped sides.

26. The wafer according to claim 24, wherein the plurality of trenches are spaced randomly apart with respect to the die regions.

27. The wafer according to claim 24, wherein the width of the trenches are approximately one quarter the width of the die regions.

28. The wafer according to claim 24, wherein the trenches are spaced to avoid the scribing borders.

29. The wafer according to claim 24, wherein the trenches are not of sufficient length to form a straight groove in a pattern of the banks coinciding with the die regions.

30. The wafer according to claim 24, wherein the trenches and the conductive layer are adapted to reduce substrate electrical resistance.

31. The wafer according to claim 24, wherein the trenches and the conductive layer are adapted to increase substrate thermal conductivity.

32. The wafer according to claim 24, wherein the length of the trenches are approximately one quarter the length of the die regions.

33. A method of fabricating a semiconductor device, comprising:
a means for forming an active region about a front-side of a substrate; and
a means for forming a plurality of trenches about a back-side of the substrate, whereby a grid of banks for maintaining structural strength of the substrate is formed between the trenches.

34. The method of fabricating a semiconductor device according to claim 33, further comprising:
a means for depositing a conductive layer, wherein the conductive layer conformal coats the trenches and banks formed about the back-side of the substrate.

35. The method of fabricating a semiconductor device according to claim 34, wherein the trenches and the conducting layer are adapted to reduce substrate electrical resistance.

36. The method of fabricating a semiconductor device according to claim 35, wherein the trenches and the conducting layer are adapted to increase substrate thermal conductivity.

37. The method of fabricating a semiconductor device according to claim 36, wherein the trenches and the conducting layer are adapted to increase reliability of the semiconductor device.

38. The method of fabricating a semiconductor device according to claim 37, wherein the banks and conductive layer are adapted to assure mechanical stiffness of the substrate.

* * * * *